(12) United States Patent
DeStasi et al.

(10) Patent No.: US 7,583,138 B1
(45) Date of Patent: Sep. 1, 2009

(54) SYSTEM AND METHOD FOR CONTROLLING AN ERROR AMPLIFIER BETWEEN CONTROL MODE CHANGES

(75) Inventors: Frank DeStasi, San Leandro, CA (US); Michael Eugene Broach, San Mateo, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/983,784

(22) Filed: Nov. 9, 2007

(51) Int. Cl.
*H03F 3/38* (2006.01)
(52) U.S. Cl. .................................. 330/10; 330/253
(58) Field of Classification Search ............... 330/10, 330/253, 257, 51, 261
See application file for complete search history.

(56) References Cited

U.S. PATENT DOCUMENTS

| 6,304,143 | B1 | 10/2001 | Corsi et al. | |
|---|---|---|---|---|
| 6,310,520 | B1 | 10/2001 | Walden | |
| 6,741,129 | B1 | 5/2004 | Corsi et al. | |
| 6,911,858 | B2 * | 6/2005 | Mori | 327/307 |
| 7,459,967 | B2 * | 12/2008 | Tsuchi et al. | 330/9 |

OTHER PUBLICATIONS

R. Klinke, et al., "A Very-High-Slew-Rate CMOS Operational Amplifier", IEEE Journal of Solid-State Circuits, vol. 24, No. 3, Jun. 1989, p. 744-746.

K. Nagaraj, "CMOS Amplifiers Incorporating a Novel Slew Rate Enhancement Technique", IEEE 1990 Custom Integrated Circuits Conference, p. 11.6.1-11.6.5.

Jeongjin Roh, "High-Performance Error Amplifier for Fast Transient DC-DC Converters", IEEE Transactions on Circuits and Systems-II: Express Briefs, vol. 52, No. 9, Sep. 2005, p. 591-595.

Hong-Wei Huang, et al., "Fast Transient DC-DC Converter with On-Chip Compensated Error Amplifier", 2006 IEEE, p. 324-327.

M. Kayal, et al., "New Error Amplifier Topology for Low Dropout Voltage Regulators Using Compound OTA-OPAMP", 2006 IEEE, p. 536-539.

\* cited by examiner

*Primary Examiner*—Henry K Choe

(57) ABSTRACT

A system and a method are disclosed for controlling an error amplifier between control mode changes. An error amplifier comprises a first stage that comprises a first current source and a second stage that comprises a second current source and at least one compensation component that is connected to the first stage through a signal line. A buffer circuit is connected between the signal line and the at least one compensation component and a switch circuit is connected between the buffer circuit and the at least one compensation component. When switched in to the error amplifier the buffer circuit provides a value of current to the at least one compensation component that is larger than a value of current that is provided to the at least one compensation component from the signal line. This increases the slew rate of the error amplifier during a pulse frequency modulation control mode.

20 Claims, 3 Drawing Sheets

US 7,583,138 B1

SYSTEM AND METHOD FOR CONTROLLING AN ERROR AMPLIFIER BETWEEN CONTROL MODE CHANGES

TECHNICAL FIELD OF THE INVENTION

The present invention is generally directed to the semiconductor circuits and, in particular, to a system and method for controlling an error amplifier during control mode changes.

BACKGROUND OF THE INVENTION

In a switch-mode direct current (DC) to direct current (DC) converter, the error amplifier must slew rapidly when the control mode changes from a pulse frequency modulation (PFM) control mode to a pulse width modulation (PWM) control mode or from a pulse width modulation (PWM) control mode to a pulse frequency modulation (PFM) control mode. The slew rate is the rate of change in output voltage in response to an input signal. It is desirable to have a high value of slew rate.

Circuitry in a DC-DC converter that is capable of providing a high slew rate may not be compatible with achieving a desired level of performance for other circuit elements. For example, circuitry that enables a high slew rate to be maintained in a DC-DC converter may be in conflict with a design requirement to maintain a low value of bias current.

In DC-DC converter circuits that employ both a pulse frequency modulation (PFM) control mode of operation and a pulse width modulation (PWM) of operation it is difficult to prevent the occurrence of a large transient in the output voltage when the control mode is changed. The large transient in the output voltage when the control mode is changed is due in large part to the slow operation of the error amplifier of the DC-DC converter.

FIG. 1 illustrates a typical prior art error amplifier 100 of a DC-DC converter. The error amplifier 100 comprises a first stage and a second stage. The first stage comprises a first current source 110 having a current value of $I_1$. A typical value of current $I_1$ for first current source 110 is eight microamperes (8 µA). A first end of the first current source 110 is connected to a V+ power supply rail. A typical value of voltage for the V+ power supply rail is three and six tenths volts (3.6 V). A second end of the first current source 110 is connected to the source of a first PMOS transistor M1 and to the source of a second PMOS transistor M2 as shown in FIG. 1. A typical value of size for the PMOS transistor M1 and for the PMOS transistor M2 is two hundred microns (200 µm) by three microns (3 µm). The gate of PMOS transistor M1 is connected to a negative differential input signal and the gate of PMOS transistor M2 is connected to a positive differential input signal.

The drain of the PMOS transistor M1 is connected to the drain of a first NMOS transistor M3 and the drain of the PMOS transistor M2 is connected to the drain of a second NMOS transistor M4 as shown in FIG. 1. A typical value of size for the NMOS transistor M3 and for the NMOS transistor M4 is twenty microns (20 µm) by five microns (5 µm). The source of NMOS transistor M3 and the source of NMOS transistor M4 are connected to ground. The gate of NMOS transistor M3 is connected to the gate of the NMOS transistor M4. The gate of the NMOS transistor M3 is also connected to the drain of NMOS transistor M3. The drain of the PMOS transistor M2 and the drain of the NMOS transistor M4 are connected to the second stage of the error amplifier 100 by signal line 130.

The second stage of the error amplifier 100 comprises a second current source 120 having a current value of $I_2$. A typical value of current $I_2$ for second current source 120 is sixteen microamperes (16 µA). A first end of the second current source 120 is connected to the V+ power supply rail. A second end of the second current source 120 is connected to the drain of a third NMOS transistor M5. A typical value of size for the NMOS transistor M5 is twenty microns (20 µm) by three microns (3 µm). The gate of the third NMOS transistor M5 is connected to the signal line 130 and the source of the NMOS transistor M5 is connected to ground.

Resistor R1 and capacitor C1 are compensation components of the error amplifier 100. A typical value of resistance for resistor R1 is fifty thousand ohms (50 kilohms). A typical value of capacitance for capacitor C1 is fifty picofarads (50 pF). Resistor R1 and capacitor C1 are connected in series as shown in FIG. 1. A first end of resistor R1 is connected to the signal line 130. A second end of the resistor R2 is connected to a first end of the capacitor C1. A second end of the capacitor C1 is connected to a node 140 that is located between the second current source 120 and the third NMOS transistor M5.

Node 140 is also connected to an output node 150 of the error amplifier 100 that provides the control voltage $V_{CTRL}$. As shown in FIG. 1, the error amplifier 100 also comprises a first diode D1 and a second diode D2 that are connected to clamping voltages. The anode of the first diode D1 is connected to a clamping voltage that is designated CLAMP− in FIG. 1. A typical voltage value for the clamping voltage CLAMP− is one half volt (0.5 V). The cathode of the first diode D1 is connected to the output node 150. The anode of the second diode D2 is also connected to the output node 150. The cathode of the second diode D2 is connected to a clamping voltage that is designated CLAMP+ in FIG. 1. A typical voltage value for the clamping voltage CLAMP+ is one and one half volt (1.5 V).

The relatively large value of capacitance for the capacitor C1 and the relatively small values of the bias currents cause the error amplifier to be relatively slow to respond to the ripple voltage in the output of the DC to DC converter in the pulse frequency modulation (PFM) control mode.

Therefore, there is a need in the art for a system and method that is capable of improving the performance of an error amplifier when the control mode of the error amplifier is changed. There is a need in the art for a system and method that is capable of increasing the slew rate of the error amplifier so that the error amplifier will perform sufficiently quickly when the control mode of the error amplifier is changed.

SUMMARY OF THE INVENTION

To address the above-discussed deficiencies of the prior art, it is a primary object of the present invention to provide a system and method for improving the performance of an error amplifier when the control mode of the error amplifier is changed.

One advantageous embodiment of the invention comprises a buffer circuit that is capable of providing a relatively large charging current to a compensation capacitor of the error amplifier when the error amplifier is operating in a pulse frequency modulation (PFM) control mode. The relatively large charging current from the buffer circuit enables the error amplifier to operate at an increased slew rate. A switching circuit is provided between the buffer circuit and the compensation capacitor. The switching circuit operates in response to control signals to switch the error amplifier between a pulse frequency modulation (PFM) control mode and a pulse width modulation (PWM) control mode.

Another advantageous embodiment of the invention also comprises a second buffer circuit and a second switching circuit that are capable of providing an additional second charging current to the compensation capacitor when the error amplifier is operating in a pulse frequency modulation (PFM) control mode.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
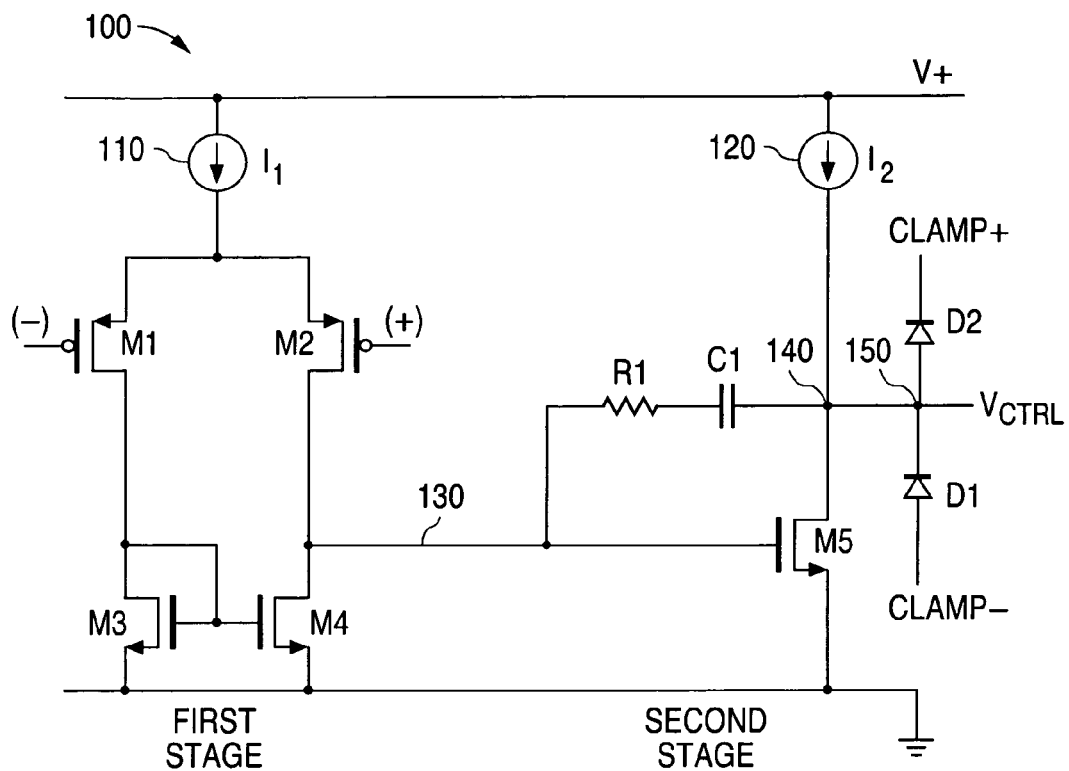
FIG. 1 illustrates a schematic diagram of an exemplary prior art error amplifier of a direct current (DC) to direct current (DC) converter.

FIGS. 2 through 6 and the various embodiments used to describe the principles of the present invention in this patent document are by way of illustration only and should not be construed in any way to limit the scope of the invention. Those skilled in the art will understand that the principles of the present invention may be implemented in any type of suitably arranged error amplifier circuit.

To simplify the drawings the reference numerals from previous drawings will sometimes not be repeated for structures that have already been identified.

Figure 2:
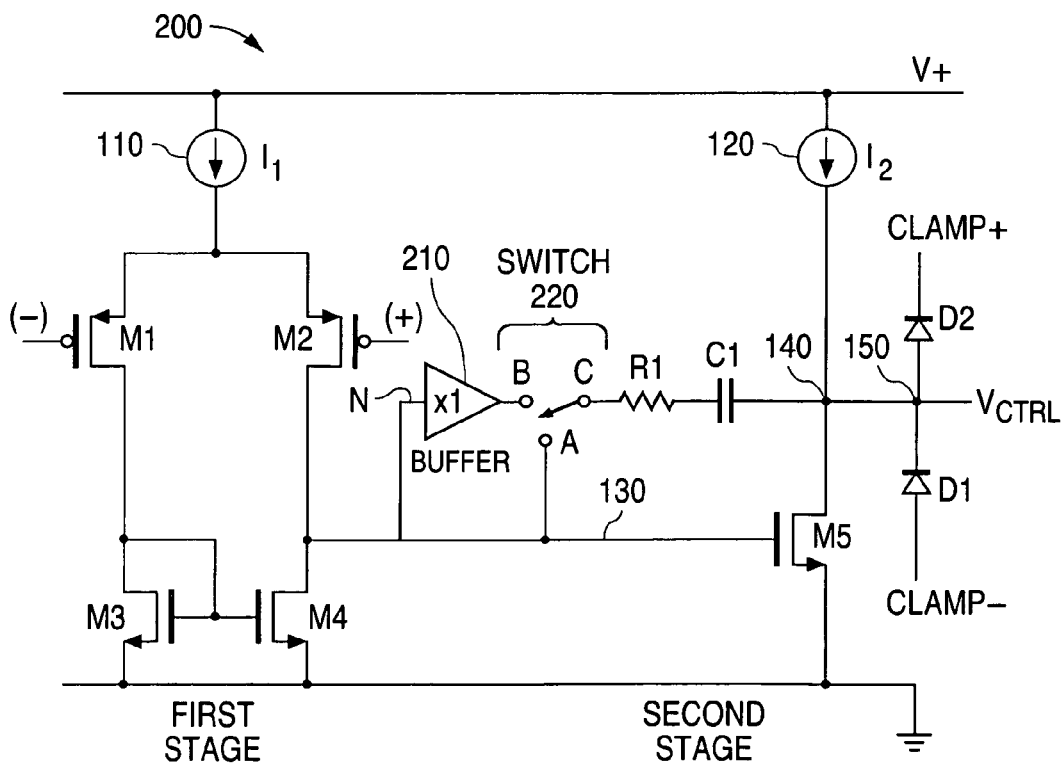
FIG. 2 illustrates a schematic diagram of an advantageous embodiment of an error amplifier of a direct current (DC) to direct current (DC) converter in accordance with the principles of the present invention.

FIG. 2 illustrates a schematic diagram of an advantageous embodiment of an error amplifier 200 of a direct current (DC) to direct current (DC) converter in accordance with the principles of the present invention. The error amplifier 200 that is shown in FIG. 2 comprises many of the same elements as the prior art amplifier 100 that is shown in FIG. 1. The structure and function of the elements that error amplifier 200 has in common with error amplifier 100 have already been described. Error amplifier 200 also comprises a buffer circuit 210 (sometimes simply referred to as buffer 210) and a switch circuit 220 (sometimes simply referred to as switch 220) connected as shown in FIG. 2.

The input to buffer 210 is connected to the signal line 130. For convenience of description the input to buffer 210 will be referred to as Node N. The output of buffer 210 is connected to Node B of switch 220. Node A of switch 220 is connected to signal line 130. The output of switch 220 is connected to Node C. In the prior art error amplifier 100 the first end of resistor R1 is connected to signal line 130. In the error amplifier 200 of the invention the first end of resistor R1 is connected to the output of the switch at Node C.

When the switch 220 operates to connect Node A and Node C then the error amplifier 200 has the same topology as the prior art error amplifier 100. This is the pulse width modulation (PWM) control mode. When the switch 220 operates to connect Node A and Node C in the pulse width modulation (PWM) control mode, the first stage of the error amplifier 200 provides current to the compensation components (resistor R1 and capacitor C1).

When the switch 220 operates to connect Node B and Node C then the compensation components (resistor R1 and capacitor C1) are driven by the buffer 210. This is the pulse frequency modulation (PFM) mode). The buffer 210 is able to supply a larger current to the compensation capacitor C1 than the first stage of the error amplifier 200 is able to supply. This larger current allows the error amplifier 200 to respond more quickly to the ripple voltage in the output of the DC to DC converter in the pulse frequency modulation (PFM) control mode. In addition, the buffer 210 will charge the compensation capacitor C1 to almost the exact point needed for correct regulation when the control mode changes back to the pulse width modulation (PWM) control mode.

In this manner large transients in the output voltage of the direct current (DC) to direct current (DC) regulator can be greatly reduced. When the error amplifier 200 is biased near the point where it would be in the pulse width modulation (PWM) control mode, there will be little transient in the output voltage of the DC to DC converter when the switch 220 is switched from the pulse frequency modulation (PFM) control mode (Node B connected to Node C) to the pulse width modulation (PWM) control mode (Node A connected to Node C).

Figure 3:
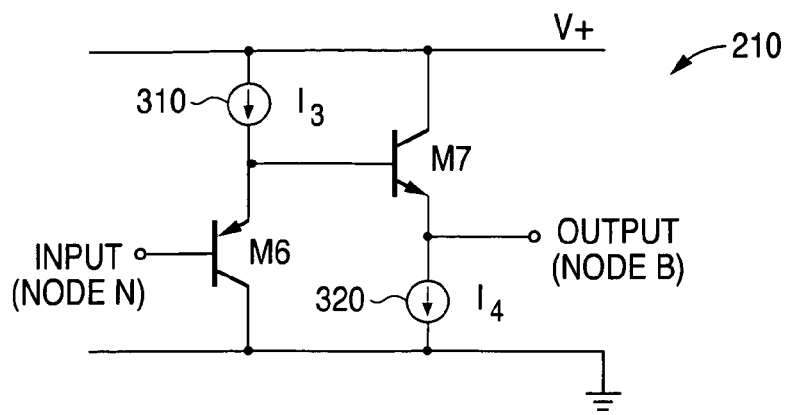
FIG. 3 illustrates a schematic diagram of a buffer circuit in accordance with the principles of the present invention.

FIG. 3 illustrates a schematic diagram showing a more detailed version of the buffer circuit 210 in accordance with the principles of the present invention. The buffer circuit 210 that is shown in FIG. 3 is one advantageous embodiment. It is understood that other types of circuitry may be employed to embody buffer circuit 210.

This advantageous embodiment of buffer circuitry 210 comprises a third current source 310 having a current value of $I_3$. A typical value of current $I_3$ for the third current source 310 is eight microamperes (8 μA). The third current source 310 is also referred to as a first buffer current source. A first end of the third current source 310 is connected to a V+ power supply rail. A second end of the third current source 310 is connected to the emitter of a first bipolar junction transistor M6 and to the base of a second bipolar junction transistor M7 as shown in FIG. 3. The base of bipolar junction transistor M6 is connected to the input of the buffer circuit 210 at Node N. The collector of the bipolar junction transistor M6 is connected to ground.

The collector of the second bipolar junction transistor M7 is connected to the V+ power supply rail. The emitter of the second bipolar junction transistor M7 is connected to the output of the buffer circuit 210 at Node B. The emitter of the second bipolar junction transistor M7 is also connected to a first end of a fourth current source 320 having a current value of $I_4$. The fourth current source 320 is also referred to as a second buffer current source. A typical value of current $I_4$ for the fourth current source 320 is ten microamperes (10 µA). A second end of the fourth current source 320 is connected to ground.

Figure 4:
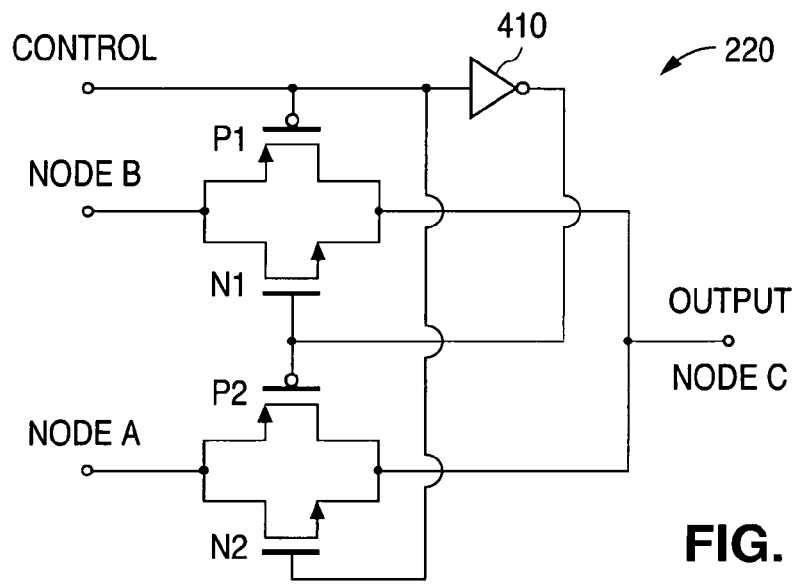
FIG. 4 illustrates a schematic diagram of a switch circuit in accordance with the principles of the present invention.

FIG. 4 illustrates a schematic diagram showing a more detailed version of the switch circuit 220 in accordance with the principles of the present invention. The switch circuit 220 that is shown in FIG. 4 is one advantageous embodiment. It is understood that other types of circuitry may be employed to embody switch circuit 220.

This advantageous embodiment of switch circuitry 220 comprises two p-type metal oxide semiconductor (PMOS) transistors (P1 and P2) and two n-type metal oxide semiconductor (NMOS) transistors and a CMOS inverter circuit 410 connected as shown in FIG. 4. The source of PMOS transistor P1 and the drain of NMOS transistor N1 are connected to Node B of the switch 220. The drain of PMOS transistor P1 and the source of NMOS transistor N1 are connected to Node C (the output node) of switch 220. A control signal is connected to the gate of PMOS transistor P1. An inverted version of the control signal is provided (through CMOS inverter 410) to the gate of NMOS transistor N1.

The source of PMOS transistor P2 and the drain of NMOS transistor N2 are connected to Node A of the switch 220. The drain of PMOS transistor P2 and the source of NMOS transistor N2 are connected to Node C (the output node) of switch 220. The control signal is connected to the gate of NMOS transistor N2. An inverted version of the control signal is provided (through CMOS inverter 410) to the gate of PMOS transistor P2.

A typical value of size for the PMOS transistor P1 and for the PMOS transistor P2 is six microns (6 µm) by one half micron (0.5 µm). A typical value of size for the NMOS transistor N1 and for the NMOS transistor N2 is three microns (3 µm) by one half micron (0.5 µm).

When the control signal has a logic "zero" value, then (1) the PMOS transistor P1 and the NMOS transistor N1 are in an "on" condition, and (2) the PMOS transistor P2 and the NMOS transistor N2 are in an "off" condition. This connects Node B to the output Node C.

When the control signal has a logic "one" value, then (1) the PMOS transistor P1 and the NMOS transistor N1 are in an "off" condition, and (2) the PMOS transistor P2 and the NMOS transistor N2 are in an "on" condition. This connects Node A to the output Node C.

The switch circuit 220 connects either Node A or Node B to the output Node C depending on the status of the control signal.

Figure 5:
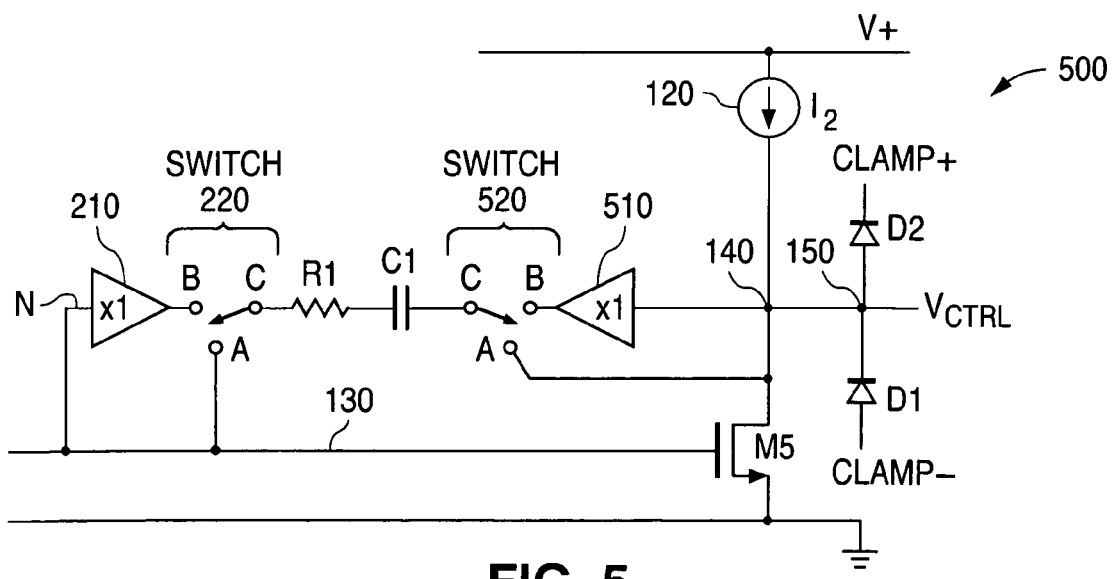
FIG. 5 illustrates a schematic diagram of another advantageous embodiment of an error amplifier of a direct current (DC) to direct current (DC) converter in accordance with the principles of the present invention.

FIG. 5 illustrates a schematic diagram of another advantageous embodiment of an error amplifier 500 of a direct current (DC) to direct current (DC) converter in accordance with the principles of the present invention. In error amplifier 500 the right hand side of the compensation components (resistor R1 and capacitor C1) can also be driven with a buffer. As shown in FIG. 5, error amplifier 500 comprises a buffer 210 and switch 220 on the left hand side of the compensation components and a buffer 510 and switch 520 on the right hand side of the compensation components. Only a portion of the error amplifier 500 is shown in FIG. 5. The buffer 510 operates in the same manner as buffer 210 and the switch 520 operates in the same manner as switch 220.

In order to improve the slew rate of the error amplifier of the invention the bias currents $I_1$ and $I_2$ may also be increased when the error amplifier is operating in the pulse frequency modulation (PFM) control mode. The values of the CLAMP+ voltage and the CLAMP– voltage may also be adjusted when the error amplifier is operating in the pulse frequency modulation (PFM) control mode. Adjusting the value of the CLAMP+ voltage and adjusting the value of the CLAMP– voltage adjusts the error amplifier bias point.

Figure 6:
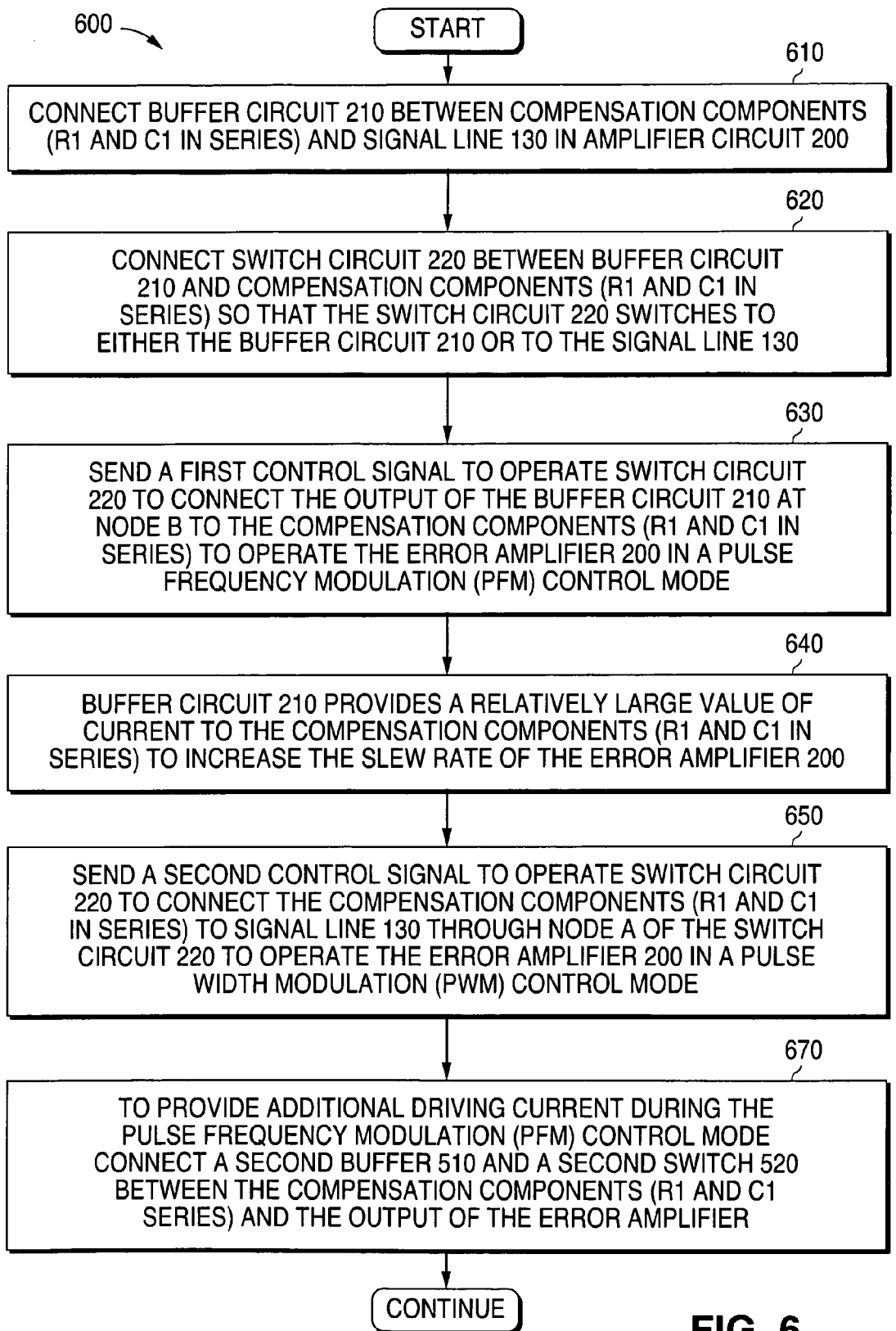
FIG. 6 illustrates a flow chart showing the steps of an advantageous embodiment of the method of the present invention.

FIG. 6 illustrates a flow chart 600 showing the steps of an advantageous embodiment of the method of the present invention. In the first step of the method the buffer circuit 210 is connected between the compensation components (R1 and C1 in series) and the signal line 130 in the amplifier circuit 200 (step 610). Then the switch circuit 220 is connected between the buffer circuit 210 and the compensation components (R1 and C1 in series) so that the switch circuit 220 switches to either the buffer circuit 210 or to the signal line 130 (step 620).

Then a first control signal is sent to operate the switch circuit 220 to connect the output of the buffer circuit 210 at Node B to the compensation components (R1 and C1 in series) to operate the error amplifier 200 in a pulse frequency modulation (PFM) control mode (step 630). The buffer circuit provides a relatively large value of current to the compensation components (R1 and C1 in series) to increase the slew rate of the error amplifier 200 (step 640).

Then a second control signal is sent to operate the switch circuit 220 to connect compensation components (R1 and C1 in series) to signal line 130 through Node A of the switch circuit 220 to operate the error amplifier 200 in a pulse width modulation (PWM) control mode (step 650).

To provide additional driving current during the pulse frequency modulation (PFM) control mode, a second buffer circuit 510 and a second switch circuit 520 are connected between the compensation components (R1 and C1 in series) and the output of the error amplifier (step 670).

Although the present invention has been described with an exemplary embodiment, various changes and modifications may be suggested to one skilled in the art. It is intended that the present invention encompass such changes and modifications as fall within the scope of the appended claims.

What is claimed is:

1. An error amplifier circuit comprising:
a first stage comprising a first current source;
a second stage comprising a second current source and at least one compensation component that is connected to the first stage through a signal line;
a buffer circuit that is connected between the signal line and the at least one compensation component; and
a switch circuit that is connected between the buffer circuit and the at least one compensation component, wherein the switch circuit comprises:
a first input node connected to an output of the buffer circuit;
a second input node connected to the signal line; and
an output node connected to the at least one compensation component.

2. The error amplifier circuit as set forth in claim 1 wherein the at least one compensation component comprises a compensation resistor and a compensation capacitor connected in series.

3. The error amplifier circuit as set forth in claim 1 wherein the buffer circuit provides a first value of current to the at least one compensation component when the buffer circuit is connected to the at least one compensation component through the switch circuit, the first value of current larger than a second value of current that is provided to the at least one compensation component when the signal line is connected to the at least one compensation component through the switch circuit.

4. The error amplifier circuit as set forth in claim 3 wherein the at least one compensation component comprises a capacitor, and the current from the buffer circuit charges the capacitor.

5. The error amplifier circuit as set forth in claim 1 wherein:
the switch circuit connects an output of the buffer circuit to the at least one compensation component in response to a first control signal; and
the switch circuit connects the signal line to the at least one compensation component in response to a second control signal.

6. The error amplifier circuit as set forth in claim 5 wherein the at least one compensation component comprises a compensation resistor and a compensation capacitor connected in series.

7. The error amplifier circuit as set forth in claim 5 wherein:
the first current source provides a first value of current to the at least one compensation component when the switch circuit connects the at least one compensation component to the signal line; and
the buffer circuit provides a larger second value of current to the at least one compensation component when the switch circuit connects the at least one compensation component to the buffer circuit.

8. The error amplifier as set forth in claim 7 wherein the buffer circuit comprises:
a first buffer current source connected in series with a first transistor wherein the first transistor is connected to an input node of the buffer circuit;
a second buffer current source connected in series with a second transistor wherein the second transistor is connected to a node between the first buffer current source and the first transistor; and
an output node connected between the second transistor and the second buffer current source.

9. The error amplifier circuit as set forth in claim 7 wherein the switch circuit comprises:
a first p-type metal oxide semiconductor transistor connected in parallel with a first n-type metal oxide semiconductor transistor and both connected between the first input node of the switch circuit and the output node of the switch circuit;
a second p-type metal oxide semiconductor transistor connected in parallel with a second n-type metal oxide semiconductor transistor and both connected between the second input node of the switch circuit and the output node of the switch circuit;
a first control signal line connected to a gate of the first p-type metal oxide semiconductor transistor and to a gate of the second n-type metal oxide signal conductor; and
a second control signal line connected through an inverter circuit to a gate of the second p-type metal oxide semiconductor transistor and to a gate of the first n-type metal oxide signal conductor.

10. An error amplifier circuit comprising:
a first stage comprising a first current source;
a second stage comprising a second current source and at least one compensation component that is connected to the first stage through a signal line;
a first buffer circuit that is connected between the signal line and the at least one compensation component;
a first switch circuit that is connected between the first buffer circuit and the at least one compensation component;
a second buffer circuit that is connected between the second current source and the at least one compensation component; and
a second switch circuit that is connected between the second buffer circuit and the at least one compensation component.

11. The error amplifier circuit as set forth in claim 10 wherein the at least one compensation component comprises a compensation resistor and a compensation capacitor connected in series.

12. A method comprising the steps of:
providing a first stage of an error amplifier circuit, the first stage comprising a first current source;
providing a second stage of the error amplifier circuit, the second stage comprising a second current source and at least one compensation component that is connected to the first stage through a signal line, the at least one compensation component comprising a compensation resistor and a compensation capacitor connected in series;
connecting a buffer circuit between the signal line and the at least one compensation component; and
connecting a switch circuit between the buffer circuit and the at least one compensation component.

13. A method of operating an error amplifier circuit comprising a first stage and a second stage, the first stage comprising a first current source, the second stage comprising a second current source and at least one compensation component connected to the first stage through a signal line, the method comprising the steps of:
operating a switch circuit to connect a buffer circuit to the at least one compensation component to operate the error amplifier in a pulse frequency modulation control mode, the buffer circuit connected between the signal line and the at least one compensation component, the switch circuit connected between the buffer circuit and the at least one compensation component; and
operating the switch circuit to connect the signal line to the at least one compensation component to operate the error amplifier in a pulse width modulation control mode.

14. The method as set forth in claim 13 further comprising the step of:
increasing a slew rate of the error amplifier by providing a first value of current to the at least one compensation component when the error amplifier is operating in the pulse frequency modulation control mode, the first value of current larger than a second value of current that is provided to the at least one compensation component when the error amplifier is operating in the pulse width modulation control mode.

15. The method as set forth in claim 13 further comprising the steps of:
providing an increased value of current from the first current source and providing an increased value of current from the second current source when the error amplifier is operating in the pulse frequency modulation control mode; and
adjusting a value of an error amplifier bias point when the error amplifier is operating in the pulse frequency modulation control mode by adjusting a value of a clamp voltage of the second stage.

16. The method as set forth in claim 12 further comprising the steps of:
- connecting a second buffer circuit between the second current source and the at least one compensation component; and
- connecting a second switch circuit between the second buffer circuit and the at least one compensation component.

17. A direct current to direct current converter that comprises an error amplifier, the error amplifier comprising:
- a first stage comprising a first current source;
- a second stage comprising a second current source and at least one compensation component that is connected to the first stage through a signal line;
- a buffer circuit that is connected between the signal line and the at least one compensation component; and
- a switch circuit that is connected between the buffer circuit and the at least one compensation component;
- wherein the buffer circuit provides a first value of current to the at least one compensation component when the buffer circuit is connected to the at least one compensation component through the switch circuit, the first value of current larger than a second value of current that is provided to the at least one compensation component when the signal line is connected to the at least one compensation component through the switch circuit.

18. The error amplifier of claim 10, wherein the first switch circuit comprises:
- a first input node connected to an output of the buffer circuit;
- a second input node connected to the signal line; and
- an output node connected to the at least one compensation component.

19. The method of claim 12, wherein the switch circuit is configured to:
- connect the buffer circuit to the at least one compensation component to operate the error amplifier in a pulse frequency modulation control mode; and
- connect the signal line to the at least one compensation component to operate the error amplifier in a pulse width modulation control mode.

20. The direct current to direct current converter of claim 17, further comprising:
- a second buffer circuit that is connected between the second current source and the at least one compensation component; and
- a second switch circuit that is connected between the second buffer circuit and the at least one compensation component.

* * * * *